United States Patent
Sahandiesfanjani et al.

(10) Patent No.: US 8,890,608 B2
(45) Date of Patent: Nov. 18, 2014

(54) DIGITAL INPUT CLASS-D AUDIO AMPLIFIER

(75) Inventors: Farzad Sahandiesfanjani, San Jose, CA (US); Peter Kavanagh, San Jose, CA (US)

(73) Assignee: Texas Instruments Incorporated, Dallas, TX (US)

( * ) Notice: Subject to any disclaimer, the term of this patent is extended or adjusted under 35 U.S.C. 154(b) by 452 days.

(21) Appl. No.: 13/408,400

(22) Filed: Feb. 29, 2012

(65) Prior Publication Data

US 2013/0223652 A1 Aug. 29, 2013

(51) Int. Cl.
 *H03F 3/38* (2006.01)
 *H03F 3/217* (2006.01)
 *H03F 99/00* (2009.01)

(52) U.S. Cl.
 USPC .............. 330/10; 330/251; 381/120; 381/121

(58) Field of Classification Search
 USPC ............. 381/120, 121, 28, 56, 57, 61, 74, 83, 381/84, 86, 93, 94.1, 101, 102, 104; 330/10, 207 A, 251; 700/94
 See application file for complete search history.

(56) References Cited

U.S. PATENT DOCUMENTS

| | | | |
|---|---|---|---|
| 5,917,369 A | 6/1999 | Nguyen | |
| 7,043,033 B1 | 5/2006 | Toosky | |
| 7,058,464 B2 * | 6/2006 | Mallinson | 700/94 |
| 7,221,297 B2 * | 5/2007 | Ohkuri et al. | 341/120 |
| 7,554,408 B2 | 6/2009 | Chen et al. | |
| 7,557,744 B2 | 7/2009 | Ido et al. | |
| 7,701,294 B1 | 4/2010 | Yun | |
| 7,822,400 B1 | 10/2010 | Son | |
| 8,385,468 B2 * | 2/2013 | Karthaus et al. | 375/300 |
| 2005/0012546 A1 * | 1/2005 | Jeong et al. | 330/10 |
| 2007/0083277 A1 * | 4/2007 | Mallinson et al. | 700/94 |
| 2008/0211578 A1 * | 9/2008 | Morishima | 330/251 |
| 2009/0167431 A1 | 7/2009 | Guilherme et al. | |
| 2009/0315623 A1 | 12/2009 | Dooper et al. | |
| 2010/0074368 A1 * | 3/2010 | Karthaus et al. | 375/296 |
| 2010/0239102 A1 * | 9/2010 | Miao et al. | 381/73.1 |
| 2010/0318205 A1 * | 12/2010 | Ohkuri et al. | 700/94 |
| 2011/0037517 A1 | 2/2011 | Teplechuk | |
| 2011/0102223 A1 * | 5/2011 | Kinyua et al. | 341/143 |

OTHER PUBLICATIONS

Leberer et al, "An AlGaN/GaN Class S Amplifier for RF-Communication Signals", IEEE, 2008.*
"Digital Input Stereo, 2 W, Class-D Audio Power Amplifier," SSM2518, Analog Devices Data Sheet, pp. 1-44, 2011.

* cited by examiner

*Primary Examiner* — Vivian Chin
*Assistant Examiner* — David Ton
(74) *Attorney, Agent, or Firm* — Andrew Viger; Frederick J. Telecky, Jr.

(57) ABSTRACT

An audio amplifier receiving a digital input audio signal and generating an output audio signal for driving a speaker includes a digital input class D amplifier configured to receive the digital input audio signal and to generate the output audio signal. The digital input class D amplifier includes a first modulator configured to receive the digital input audio signal and to generate a quasi-digital signal in n-bit, and a class D modulator configured to receive the n-bit quasi-digital signal and to generate the output audio signal, the class D modulator implementing an analog feedback loop. In some embodiments, the class D modulator is implemented using a PWM modulator. In other embodiments, the PWM modulator incorporates enhanced features to improve the output noise characteristics.

18 Claims, 7 Drawing Sheets

_US 8,890,608 B2_

DIGITAL INPUT CLASS-D AUDIO AMPLIFIER

FIELD OF THE INVENTION

The invention relates to audio amplifiers and, in particular, to a digital input class-D audio amplifier with improved performance and reduced size.

DESCRIPTION OF THE RELATED ART

An audio amplifier is a power amplifier that amplifies low-power audio signals (signals composed primarily of frequencies between 20 Hz-20 KHz) to a level suitable for driving a speaker. Audio amplifiers employed in the final stage of a audio playback chain to amplify audio signals for playback on a speaker which can be a headset or a speaker on a mobile device. Audio amplifiers typically receive input audio signals that are in the analog domain and the audio amplifiers are often implemented using class AB amplifiers or class D amplifiers.

More recently, audio signals are often generated from digital applications where the audio signals are in the digital domain. For example, digital input audio signals may be generated from digital audio data stored on a compact disk (CD) or a digital audio player. Digital input audio signals may also be generated from a codec (coder-decoder) or from the baseband of a wireless communication device. Because audio amplifiers are typically configured to receive an analog input audio signal, the digital input audio signal is typically converted to analog signals and then amplified using the traditional audio amplifier architecture.

FIG. 1 is a schematic diagram illustrating a conventional audio amplifier configured to receive a digital input audio signal. To accommodate a digital input audio signal 2, such as a digital signal in 18-24 bits, an audio amplifier 1 includes a digital-to-analog converter (DAC) 4 to convert the digital input signal 2 into an analog signal 5. The converted analog signal 5 is then coupled to an amplifier 6 to be amplified to generate an output audio signal 7. The output audio signal 7 is coupled to drive a speaker 8. The amplifier 6 may be implemented as a class AB amplifier or a class D amplifier. Class AB amplifiers are analog drivers and amplify the converted analog signal 5 with enough power to drive the speaker. Class D amplifiers operate by switching its output fully on or fully off and class D amplifiers are therefore considered "digital" amplifiers. Class D amplifiers generate a digital output signal which is filtered by a low-pass filter to derive the desired output audio signal 7 for driving the speaker.

Digital-to-analog converter (DAC) designs are well known. Typically, as shown in FIG. 1, a DAC is constructed using a modulator 9 followed by an amplifier 10. Amplifier 10 in the DAC is also referred to as a "reconstruction filter" which provides low pass filtering function as well as amplification function for the DAC. Accordingly, in the signal path from the digital input audio signal 2 to the speaker 8, the audio signal is subjected to two amplifier circuits which can potentially introduce noise to the audio signal. More specifically, the digital input audio signal may itself has noise components and those noise may get multiplied at the DAC amplifier 10 regardless of the structure of the amplifier 6 (class AB or class D). Then, the amplification stage of the amplifier 6 may further introduce noise to the audio signal. In practice, there is a limit to how much noise can be tolerated at the speaker.

There is a need to reduce the noise at the output of the audio amplifier, especially for digital input audio signals. For instance, a noise level of 30 µV is sometimes required for modern day applications. The conventional audio amplifier, such as audio amplifier 1 of FIG. 1, suffers from large noise level, such as 100 µV, and is not capable of meeting the low-noise requirement of modern day applications. In order to improve the noise level, the conventional audio amplifier has to be implemented using a sophisticated DAC and has to be operated at a high power consumption level in order to keep the two amplifier circuits at low noise level. However, the high power consumption level limits the amount of noise reduction that can be realized at the final audio output.

Audio amplifier designs for receiving a digital input audio signal and providing a digital output audio signal have been proposed. Such a circuit block is often referred to as a "digital input class D audio amplifier." In the digital input class D audio amplifier, the digital-to-analog conversion (DAC) circuit is eliminated and the digital input audio signal is processed by the digital input class D audio amplifier 12 directly, without being converted first to the analog domain. In practical implementation, circuitry for digital processing and feedback are required to complete the digital input class D amplifier implementation.

FIG. 2 is a schematic diagram of a digital input audio amplifier system employing a digital input class D amplifier in an exemplary implementation. Referring to FIG. 3, a digital input audio amplifier system 20 receives a digital input audio signal 2 in m-bit and generates an output audio signal 25 to drive the speaker 8. In the audio amplifier system 20, the m-bit digital input audio signal 2 is first coupled to a sigma-delta ($\Sigma\Delta$) modulator 22 which converts the m-bit digital signal to a 1-bit data stream 23. The 1-bit data stream 23 will typically switch at a frequency that is m times the digital input audio signal 2. More specifically, the frequency of the 1-bit data stream 23 is a function of the oversampling ratio of the sigma-delta modulator 22 with a minimum frequency being m times the digital input audio signal. For example, when the digital input audio signal 2 is a 24-bit digital signal, the 1-bit data stream will switch at a frequency 24 times the digital input audio signal. The 1-bit data stream is provided to a digital input class D amplifier 24 to be amplified and processed. The digital input class D amplifier 24 generates the output audio signal 25 for driving the speaker 8. In operation, the digital input class D amplifier 24 receives the 1-bit digital data stream at a high frequency and operates to reduce the frequency of the 1-bit data stream to a frequency level suitable for the speaker, such as around 400 kHz.

In practical implementation, the power (Vdd) supplying the class D amplifier 24 is not an ideal power source. In some cases, the class D amplifier 24 is powered by a battery and the ground potential may drift over time. The output audio signal 25 is generally a high power signal (e.g. 2 watts). The moving ground potential on the speaker wires will cause distortion at the output audio signal. Therefore, in practical implementation, a feedback loop is needed from the audio output node (output audio signal 25) to the audio input ($\Sigma\Delta$ modulator 22) to correct for any distortion. In the exemplary embodiment shown in FIG. 3, the feedback loop is implemented using an analog-to-digital converter (ADC) 26 coupled to digitize the output audio signal 25 and provide the digitized signal to the $\Sigma\Delta$ modulator 22 to correct for errors due to distortions.

However, the requirement of a feedback loop renders the digital input audio amplifier system 20 impractical and cost prohibitive in actual implementations. This is because the feedback loop requires a sophisticated ADC 26 that can accurately sample the output audio signal. In practice, the output audio signal 25 is switching with ringing at signal transitions due to the inductance on the speaker wires. Assume the output audio signal is switching at about 400 kHz, the signal period is 2.5 µs and the rising edge is about 40 ns. To sample the output audio signal accurately, the ADC needs to sample at least 4 times over the 40 ns time frame. Thus, the ADC needs to have a 10 ns sampling clock with about 100 dB resolution to realize to a sufficiently low noise level so that the ADC can accurately sample the output audio signal. However, an ADC with 100 MHz sampling rate is prohibitively expensive to implement. The requirement for such a high sampling rate ADC renders the audio amplifier system 20 of FIG. 3 too costly and impractical in actual implementations.

SUMMARY OF THE INVENTION

According to one embodiment of the present invention, an audio amplifier receiving a digital input audio signal and generating an output audio signal for driving a speaker includes a digital input class D amplifier configured to receive the digital input audio signal and to generate the output audio signal. The digital input class D amplifier includes a first modulator configured to receive the digital input audio signal and to generate a quasi-digital signal in n-bit, and a class D modulator configured to receive the n-bit quasi-digital signal and to generate the output audio signal, the class D modulator implementing an analog feedback loop.

The present invention is better understood upon consideration of the detailed description below and the accompanying drawings.

DETAILED DESCRIPTION OF THE PREFERRED EMBODIMENTS

Figure 1:
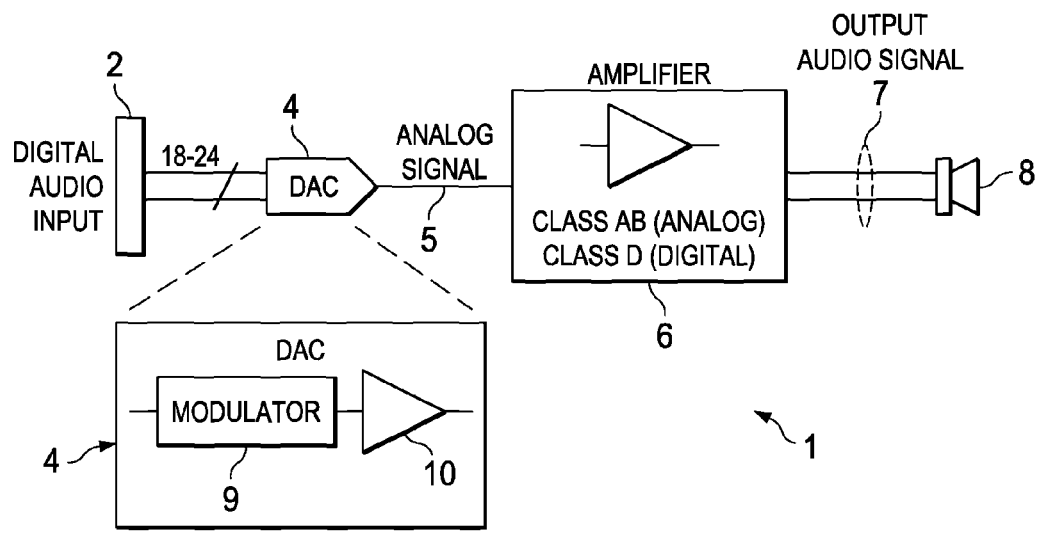
FIG. 1 is a schematic diagram illustrating a conventional audio amplifier configured to receive a digital input audio signal.

In accordance with the principles of the present invention, a digital input class D amplifier configured as an audio amplifier receives a digital input audio signal and processes the digital input audio signal using a DAC modulator coupled to a class D modulator. The digital input class D amplifier generates an output audio signal for driving a speaker. A salient feature of the digital input class D amplifier is that the digital input audio signal is not converted to the analog domain entirely but rather the DAC modulator converts the digital input audio signal to a signal in a semi-digital/semi-analog state, referred to as a "quasi-digital signal." The quasi-digital signal is then used to feed into the class D modulator where the quasi-digital signal is amplified and filtered. The class D modulator forms an analog control loop with analog feedback. In this manner, no digital feedback loop is required and the digital input class D amplifier of the present invention can be implemented using less silicon real estate and at a lower cost while capable of achieving very low output noise level. The digital input class D amplifier, as thus configured, includes only a single amplification stage in the entire audio signal path so that the digital input class D amplifier is capable of achieving exceptionally low output noise level.

In embodiments of the present invention, the class D modulator in the digital input class D amplifier is implemented using conventional class D amplifier architecture. In other embodiments, a novel class D modulator architecture incorporating enhanced features to improve the output noise characteristics is used. In embodiments of the present invention, the class D modulator is implemented as a pulse-width modulation (PWM) modulator. In one embodiment, the class D modulator may include a sample-and-hold circuit before the PWM comparator of the PWM modulator. In other embodiments, the class D modulator may further implement dynamic element matching (DEM) and/or output chopping to eliminate noise and deviations caused by circuit element mismatches.

A salient feature of the digital input class D amplifier of the present invention is that only a DAC modulator is used to process the digital input audio signal instead of a complete DAC circuit. A DAC reconstruction filter, part of the conventional DAC circuit to realize the low-pass filtering function, is not used and a complete conversion of the digital audio signal to the analog domain is not performed. Instead, the digital input audio signal is processed by the DAC modulator into a quasi-digital signal. The digital input class D amplifier of the present invention exploits the low pass filtering characteristic of the class D modulator to perform filtering of the high frequency content of the quasi-digital signal generated by the DAC modulator. More specifically, in some embodiments, the class D modulator incorporates an integrator to provide low pass filtering of the high frequency content of the quasi-digital signal. The integrator processes the low frequency content which is the analog nature of the input audio signal. Thus, the digital input class D amplifier of the present invention relies on the class D modulator to provide the low-pass filtering function so that the DAC reconstruction filter used in a conventional DAC is eliminated in the audio amplifier signal path. As thus configured, the digital input class D amplifier can be implemented with reduced silicon real estate and reduced power consumption.

Figure 2:
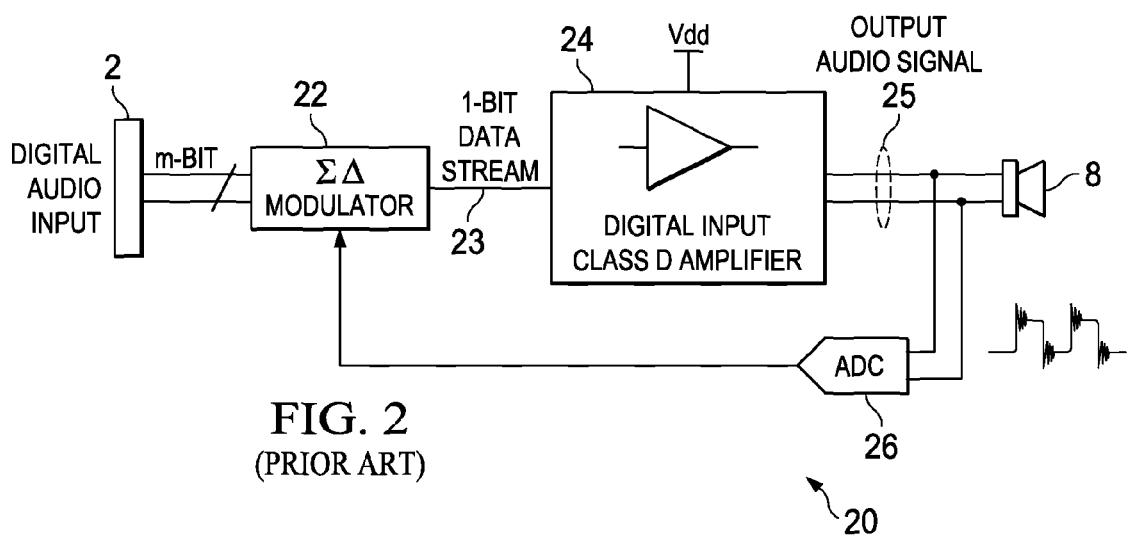
FIG. 2 is a schematic diagram of a digital input audio amplifier system employing a digital input class D audio amplifier in an exemplary implementation.

Furthermore, the digital input class D amplifier of the present invention relies on an analog feedback loop in the class D modulator to realize feedback control loop. The digital input class D amplifier of the present invention eliminates the requirement for a digital feedback loop, such as that used in the conventional digital audio amplifier system of FIG. 2. Accordingly, the digital input class D amplifier can be implemented without the need for a costly analog-to-digital converter (ADC) in the feedback loop, as in the conventional implementations.

In sum, the digital input class D amplifier of the present invention can be implemented without the DAC reconstruction filter and without the costly ADC for digital feedback. The audio amplifier can thus be implemented using smaller silicon real estate, reducing the integrated circuit die size. The audio amplifier can also operate at a lower power consumption level.

More importantly, the digital input class D amplifier of the present invention is capable of achieving very low noise level at the amplifier output. In particular, an audio amplifier thus constructed is capable of achieving an output noise level of no more than 30 μV. In particular, by eliminating the DAC reconstruction filter, the audio amplifier signal path includes only a single amplifier circuit which has the effect of reducing amplifier output noise.

Digital Input Class D Audio Amplifier System

Figure 3:
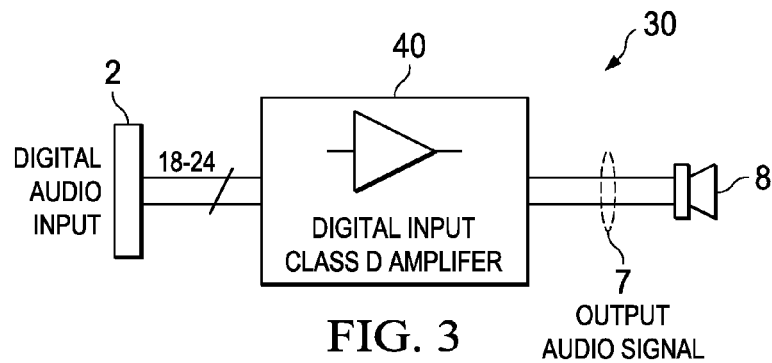
FIG. 3 illustrates an audio amplifier implemented using a digital input class D audio amplifier according to embodiments of the present invention.

FIG. 3 illustrates an audio amplifier implemented using a digital input class D audio amplifier according to embodiments of the present invention. Referring to FIG. 3, an audio amplifier 30 is implemented using a digital input class D amplifier 40. Digital input class D amplifier 40 receives a digital input audio signal 2 in m-bit and generate an output audio signal 7 to drive a speaker 8. The digital input audio signal 2 may be 18 to 24 bits. As thus constructed, the audio amplifier 30 is implemented without any digital feedback loop. The digital input class D amplifier 40 realizes all of the filtering and feedback functions to generate the audio output signal 7 with a very low noise level.

Figure 4:
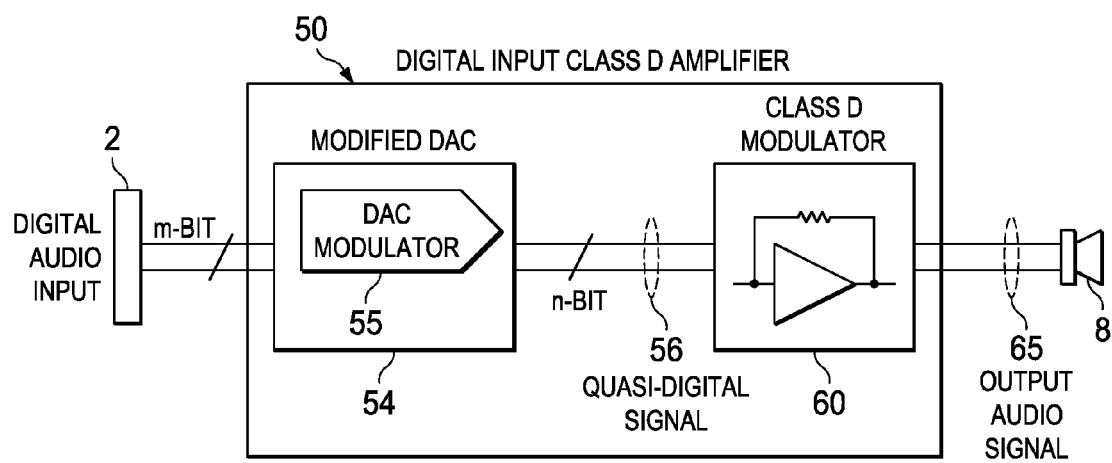
FIG. 4 is a schematic diagram of a digital input class D amplifier according to embodiments of the present invention.

FIG. 4 is a schematic diagram of a digital input class D amplifier according to embodiments of the present invention. Referring to FIG. 4, a digital input class D amplifier 50 ("class D amplifier 50") receives a digital input audio signal 2 in m-bit and generates an output audio signal 65 on a pair of speaker wires to drive a speaker 8. The digital input audio signal 2 may be 18 to 24 bits. In the class D amplifier 50, the m-bit digital input audio signal 2 is coupled to a modified DAC circuit 54 implemented using only a DAC modulator 55. The DAC modulator 55 converts the m-bit digital input audio signal to an n-bit quasi-digital signal 56. The n-bit quasi-digital signal 56 is then provided to a class D modulator 60 to be amplified and processed. The class D modulator 60 generates the output audio signal 65 having a frequency level suitable for driving the speaker 8, such as around 400 kHz. In one embodiment, the n-bit quasi-digital signal has 2 bits (n=2) with four signal levels.

The n-bit quasi-digital signal 56 generated by the modified DAC 54 switches at a high frequency as the modified DAC circuit 54 does not include a reconstruction filter for performing low pass filtering functions. Instead, the class D modulator 60 performs low-pass filtering on the n-bit quasi-digital signal 56 as well as implementing an analog feedback loop to ensure stability and accuracy of the output audio signal.

Figure 5:
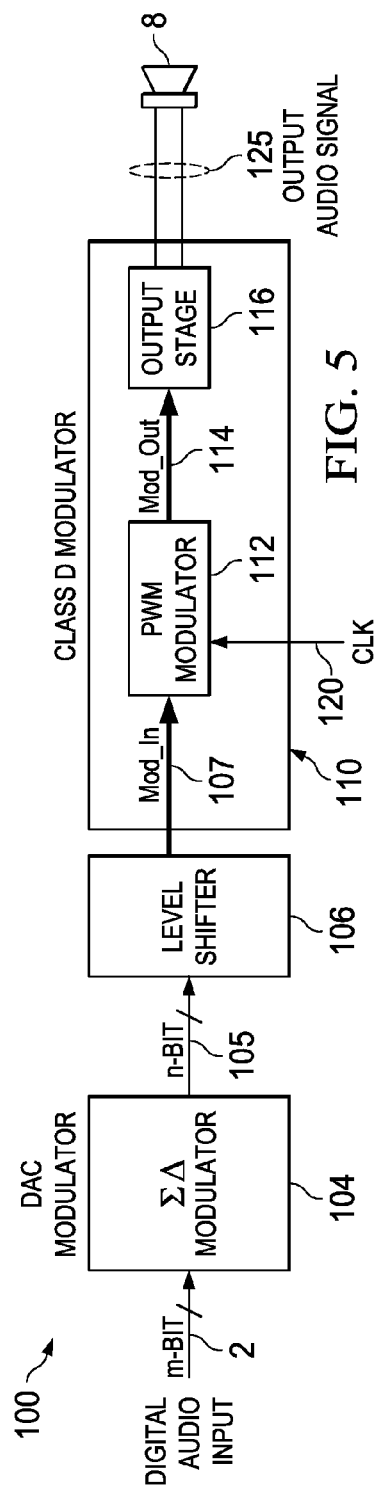
FIG. 5 is a schematic diagram illustrating an implementation of the digital input class D amplifier according to one embodiment of the present invention.

FIG. 4 illustrates the basic architecture of a digital input class D amplifier in embodiments of the present invention. FIG. 5 is a schematic diagram illustrating an implementation of the digital input class D amplifier according to one embodiment of the present invention. Referring to FIG. 5, a digital input class D amplifier 100 ("class D amplifier 100") receives a digital input audio signal 2 in m-bit and generates an output audio signal 125 on a pair of speaker wires to drive a speaker 8. In the class D amplifier 100, the m-bit digital input audio signal 2, which may be 18-24 bits, is coupled to a DAC modulator 104 which is implemented as an Nth order sigma-delta ($\Sigma\Delta$) modulator in the present embodiment. The $\Sigma\Delta$ modulator 104 converts the m-bit digital input audio signal to an n-bit quasi-digital signal 105 being an n-bit data stream. The n-bit data stream 105 has a frequency being a function of the oversampling ratio of the DAC modulator 104 and has a minimum frequency being m/n times the m-bit digital input audio signal. In one embodiment, the $\Sigma\Delta$ modulator 104 generates a 2-bit quasi-digital signal 105. In one embodiment, the $\Sigma\Delta$ modulator 104 is implemented as a $5^{th}$ order $\Sigma\Delta$ modulator.

In the present embodiment, the n-bit quasi-digital signal 105 is coupled to a level shifter 106 to adjust the DC voltage level of the signal 105. While the exact voltage levels of a digital signal is not critical because only the logical high or logical low level has to be recognized, the exact voltage level of an analog signal is critical. Therefore, the voltage level of the quasi-digital signal 105 is important as it is being fed into an analog loop formed by the class D modulator. If the power supply voltage varies causing the voltage level of the quasi-digital signal 105 to drift, the class D modulator may recognize the voltage drift as an input signal which becomes a power supply rejection issue. In embodiments of the present invention, the lever shifter 106 is used to generate a level-adjusted n-bit signal 107 having stable voltage levels. The level shifter 106 operates based on a reliable fixed reference voltage, such as a bandgap voltage. In this manner, the level shifter 106 isolates the signal 107 from power supply voltage variations. In embodiments of the present invention, the level shifter 106 generates the n-bit signal 107 as a single-end signal or as a differential signal. The level-adjusted n-bit signal 107 then serves as the modulator input signal Mod_In coupled to the input of the class D modulator 110. The level shifter 106 is optional and may be omitted in other embodiments of the digital input class D amplifier, such as when the power supply is stable or when power supply rejection is not needed.

In the present embodiment, the class D modulator 110 is implemented using a PWM modulator 112 and an output stage 116. The PWM modulator 112 is configured to receive the level-adjusted n-bit signal 107 and generate a switching or digital output signal Mod_Out 114 indicative of the digital input audio signal 2. The digital output signal Mod_Out 114 is then coupled to drive the output stage 116 to generate the output audio signal 125 for driving the speaker 8. In embodiments of the present invention, the output stage 116 is implemented using half-bridge switches, also referred to as an H-bridge output filter.

Class D Modulator

In embodiments of the present invention, the digital input class D amplifier 100 can be implemented using conventional class D modulator architecture. Class D modulators can be implemented using pulse-width modulation (PWM) or sigma-delta ($\Sigma\Delta$) modulation. In embodiments of the present invention, the class D modulator 110 is implemented using a PWM modulator. A PWM modulator has the advantage of enabling a modulation frequency to be selected to avoid interference. In some applications, such as mobile communication applications, PWM modulation is preferred as the modulation frequency can be selected to avoid interference with transmission frequencies.

Figure 6:
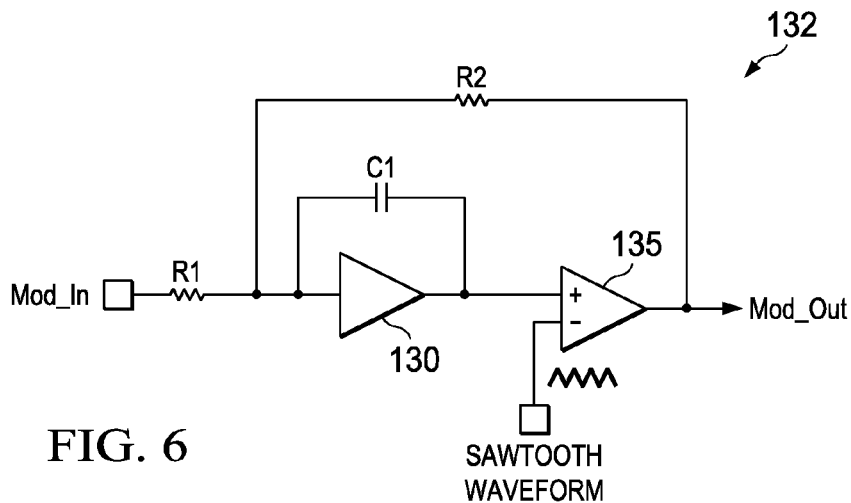
FIG. 6 is a schematic diagram of a PWM modulator which can be incorporated in the class D modulator of FIG. 5 according to one embodiment of the present invention.

FIG. 6 is a schematic diagram of a PWM modulator which can be incorporated in the class D modulator of FIG. 5 according to one embodiment of the present invention. Referring to FIG. 6, a single-ended PWM modulator 132 receives a modulator input signal (Mod_In) through an input resistor R1. The PWM modulator 132 includes an amplifier 130 and a capacitor C1 configured as an integrator. The integrator effectively low-pass filters the modulator input signal Mod_In, passing only the low frequency content of the modulator input signal to a comparator 135. The comparator 135 compares the filtered signal from the integrator with a sawtooth waveform switching at a modulation frequency. In one embodiment, the modulation frequency of the sawtooth waveform is 384 kHz. The comparator 135 operates as a PWM comparator and generates a modulator output signal Mod_Out being a pulse-width modulated signal indicative of the modulator input signal. The modulator output signal Mod_Out of PWM modulator 132 would be coupled to the output stage 116 of the class D modulator 110 in the class D amplifier 100.

Figure 7:
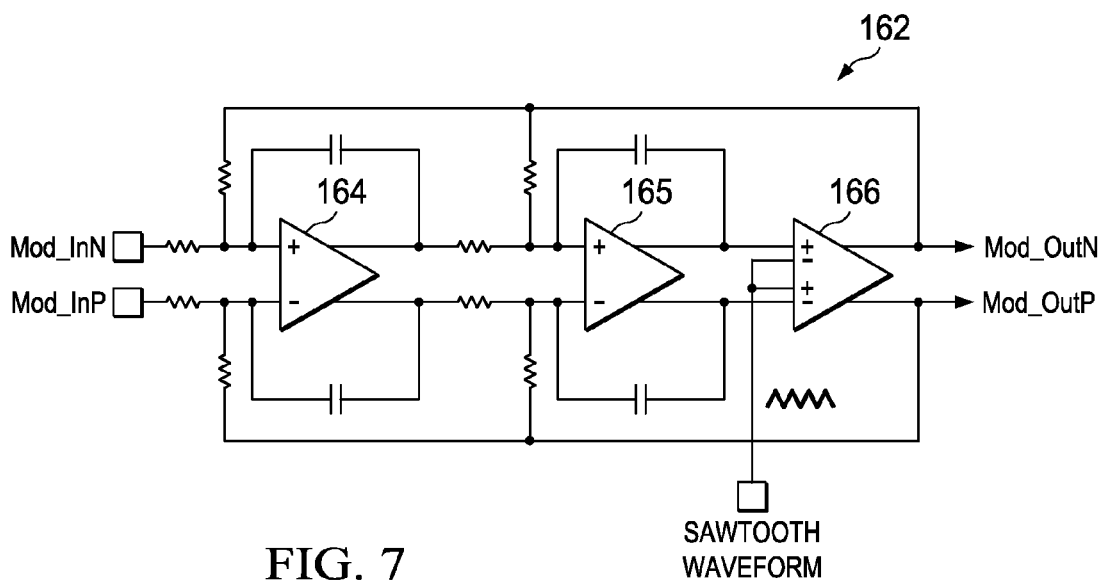
FIG. 7 is a schematic diagram of a PWM modulator with differential signaling and two integrator stages which can be incorporated in the class D modulator of FIG. 5 according to one embodiment of the present invention.

The PWM modulator in FIG. 6 illustrates a single-ended implementation with a single integrator stage. In other embodiments, the PWM modulator can be implemented using two or more integrator stages. Furthermore, the PWM modulator may also be implemented using differential signaling to improve the output noise level. FIG. 7 is a schematic diagram of a PWM modulator with differential signaling and two integrator stages which can be incorporated in the class D modulator of FIG. 5 according to one embodiment of the present invention. Referring to FIG. 7, a differential-input PWM modulator 162 receives differential modulator input signal Mod_InN and Mod_InP and generates differential modulator output signal Mod_OutN and Mod_OutP. PWM modulator 162 includes amplifiers 164 and 165, with respective capacitors to form two integrator stages. The filtered signal from the two integrator stages is coupled to a differential PWM comparator 166 to be compared with the sawtooth waveform. The PWM comparator 166 generates the differential modulator output signal Mod_OutN and Mod_OutP.

In embodiments of the present invention, the class D modulator 110 implements analog feedback control loop. In one embodiment, the PWM modulator is implemented using a cascaded integrators in feedback (CIFB) architecture to realize smooth signal transfer function with no overshoot at high frequencies. More specifically, in the single-ended implementation shown in FIG. 6, the modulator output signal is fed back through a resistor R2 to the input of the integrator (amplifier 130). In the differential implementation shown in FIG. 7, the differential modulator output signals are fed back through respective resistors to the differential input of each cascaded integrators. In other embodiments, the feedback signal may be the PWM modulator output signal or the class D modulator output signal.

Enhanced Class D Modulator

In embodiments of the present invention, the digital input class D amplifier described above is implemented using a novel class D modulator architecture incorporating enhancements to improve the output noise level of the audio amplifier system. In particular, the digital input class D amplifier implemented with one or more of the enhancements described below may achieve exceptional low noise level.

(1) Sample and Hold Circuit

Figure 8:
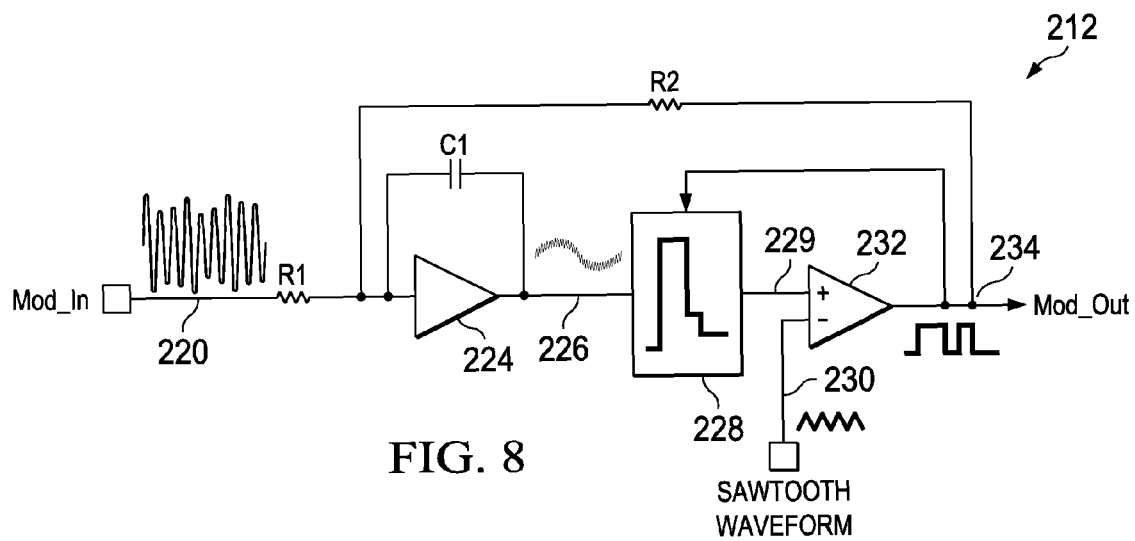
FIG. 8 is a schematic diagram of a PWM modulator incorporating a sample-and-hold circuit which can be incorporated in the class D modulator according to one embodiment of the present invention.

In embodiments of the present invention, the class D modulator 110 is implemented using a PWM modulator with a sample-and-hold circuit coupled between the integrator and the PWM comparator of the PWM modulator to improve the performance of the class D amplifier. FIG. 8 is a schematic diagram of a PWM modulator incorporating a sample-and-hold circuit which can be incorporated in the class D modulator according to one embodiment of the present invention. Referring to FIG. 8, a PWM modulator 212, when incorporated in the digital input class D amplifier 100 of FIG. 5, receives a quasi-digital signal from the DAC modulator as the modulator input signal Mod_In 220. The quasi-digital signal is a high frequency signal because the signal has not been subjected to low-pass filtering. The modulator input signal 220 is first coupled to the integrator of the PWM modulator 212 which is formed by an amplifier 224 and a capacitor C1 in a feedback configuration. Although the integrator of the PWM modulator 212 provides low-pass filtering of the modulator input signal, the resulting analog signal 226 generated by the integrator still contains noise components. When the noisy analog signal 226 is coupled to the PWM comparator 232 directly to be compared with the sawtooth waveform 230, the noise on the analog signal may result in detections of multiple cross-overs, causing the PWM comparator 232 output to switch frequently, thus generating multiple narrow pulses as the comparator output which is undesirable.

Figure 9:
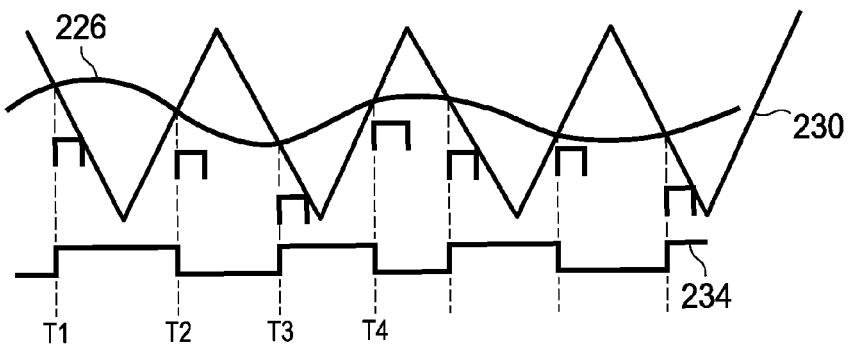
FIG. 9 is a signal waveform diagram illustrating the operation of the sample-and-hold circuit of FIG. 8.

According to embodiments of the present invention, a sample and hold circuit 228 is incorporated between the integrator (amplifier 224) and the PWM comparator 232 of the PWM modulator 212. The sample-and-hold circuit 228 receives the analog signal 226 from the amplifier 224 as an input signal and the output signal 234 of the PWM comparator 232 as a control signal. The operation of the sample-and-hold circuit 228 is illustrated with reference to FIG. 9. Referring to FIG. 9, the PWM comparator 232 compares the values of the integrator output analog signal 226 and the sawtooth waveform 230. When the analog signal 226 crosses above the sawtooth waveform 230, the modulator output signal Mod_Out 234 switches to a logical high. When the analog signal 226 crosses below the sawtooth waveform 230, the modulator output signal Mod_Out 234 switches to a logical low.

In operation, when the analog signal 226 crosses over the sawtooth waveform 230, such as at time T1, the PWM comparator 232 switches to a logical high and the sample-and-hold circuit 228 operates to hold the level of the analog signal at node 229 so that no further cross-over can occur at the PWM comparator 232 for a given time period. The sample-and-hold circuit releases the hold on node 229 after the given time period. Then, when the analog signal 226 crosses under the sawtooth waveform 230, such as at time T2, the PWM comparator 232 switches to a logical low and the sample-and-hold circuit 228 operates to hold the level of the analog signal at node 229 so that no further cross-over can occur at the PWM comparator 232 for a given time period. The sample-and-hold operation continues at time T3 and T4.

By incorporating the sample-and-hold circuit 228 in the PWM modulator 212, the performance of the PWM modulator and the digital input audio amplifier is enhanced. More specifically, the sample-and-hold circuit 228 operates to prevent high frequency pulses from being generated at the PWM modulator output 234. Accordingly, the analog bandwidth of the feedback loop can be kept high to reap the benefit on reducing total harmonic distortion, but the overall bandwidth is limited by the sample-and-hold circuit which prevents high frequency pulses from being generated at the PWM modulator output 234.

(2) Dynamic Element Matching (DEM)

Returning to FIG. 5, in embodiments of the present invention, the $\Sigma\Delta$ modulator 104 generates n-bit quasi-digital data 105. When only 1-bit is used, the digital input class D amplifier may not be able to achieve a low enough SNR for a given application. Thus, in some embodiments, the ΣΔ modulator 104 generates a quasi-digital signal in 2 or more bits so that the digital input class D amplifier 100 is able to achieve very low output noise level. In one embodiment, the ΣΔ modulator 104 generates a 2-bit quasi-digital signal for the class D modulator 110. The two bits may be the least significant bit and the most significant bit generated by the ΣΔ modulator. Furthermore, in one embodiment, the level shifter 106 converts the 2-bit quasi-digital signal to a 2-bit differential output signal as the modulator input signal Mod_In 107.

Figure 10:
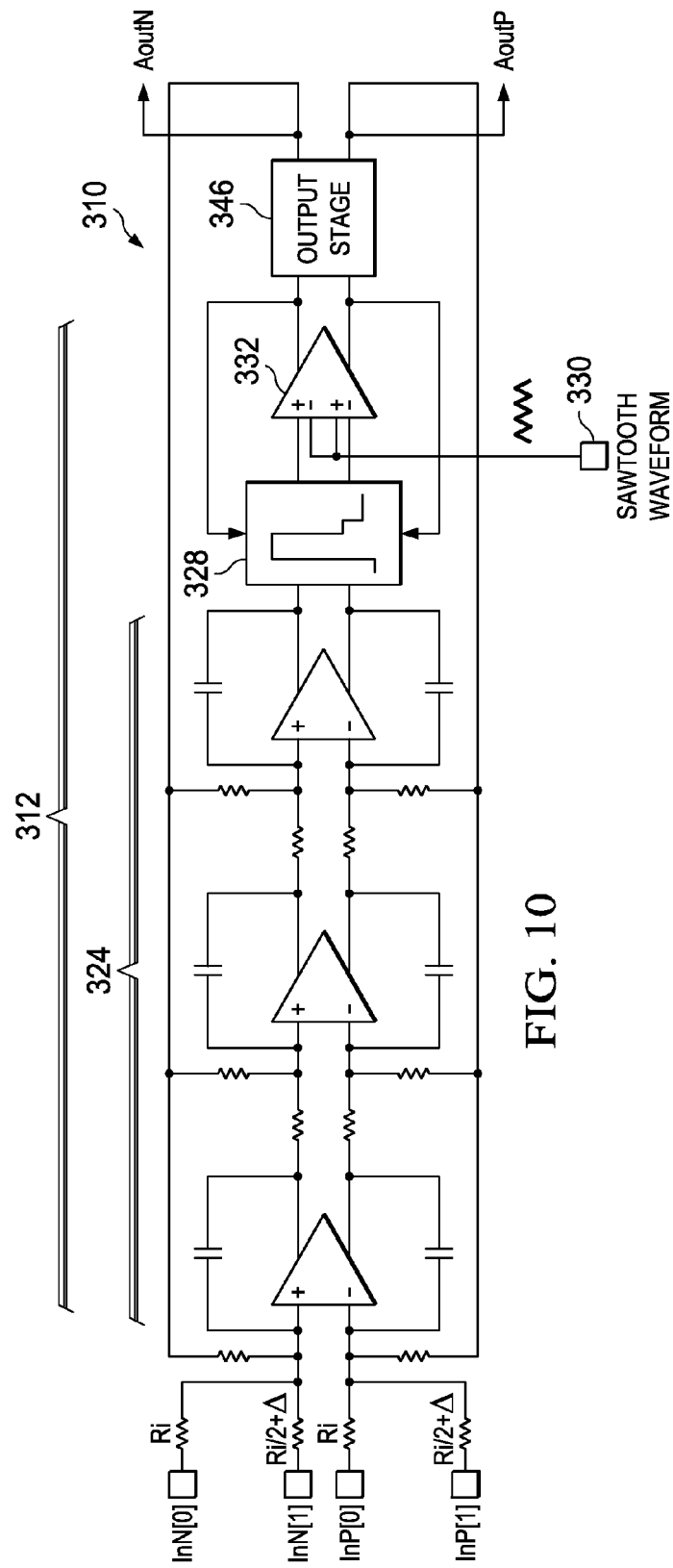
FIG. 10 is a schematic diagram of a class D modulator incorporating a differential PWM modulator configured to receive a multi-bit differential input signal according to embodiments of the present invention.

When a multi-bit input signal is provided to the class D modulator 110, the PWM modulator 112 of the class D modulator is configured to receive the multiple-bit modulator input signal. FIG. 10 is a schematic diagram of a class D modulator incorporating a differential PWM modulator configured to receive a multi-bit differential input signal according to embodiments of the present invention. Referring to FIG. 10, a class D modulator 310 includes a PWM modulator 312 and an output stage 346. The PWM modulator 312 is implemented using a third order integrator 324, followed by a sample-and-hold circuit 328 and a PWM comparator 332. The output of the PWM comparator 332 drives the output stage 346 to generate the output audio signals AoutN and AoutP.

In the present embodiment, to receive the multi-bit differential modulator input signal, PWM modulator 312 includes a bank of weighted input resistors, where each resistor receives one bit of one polarity of the input signal. In the case where the differential input signal has 2 bits, input bits InN[0] and InP[0] are coupled to respective resistors having the same weight Ri while input bits InN[1] and InP[1] are coupled to respective resistors having the same weight Ri/2. However, because of device mismatches, each pair of input resistors may not have matching resistance values. For instance, the resistance values for bit 1 should ideally be Ri/2 but is actually Ri/2+Δ, where Δ denotes the resistance variation due to resistor mismatches. Such device mismatch may cause the signal-to-noise ratio (SNR) to increase beyond the level required for a given application. In some embodiments, the PWM modulator 312 may include a bank of identical input resistors for receiving the multi-bit modulator input signal. Although it is easier to fabricate resistor of equal resistance values, even identical input resistors will have resistance variation, causing device mismatch errors.

Figure 11:
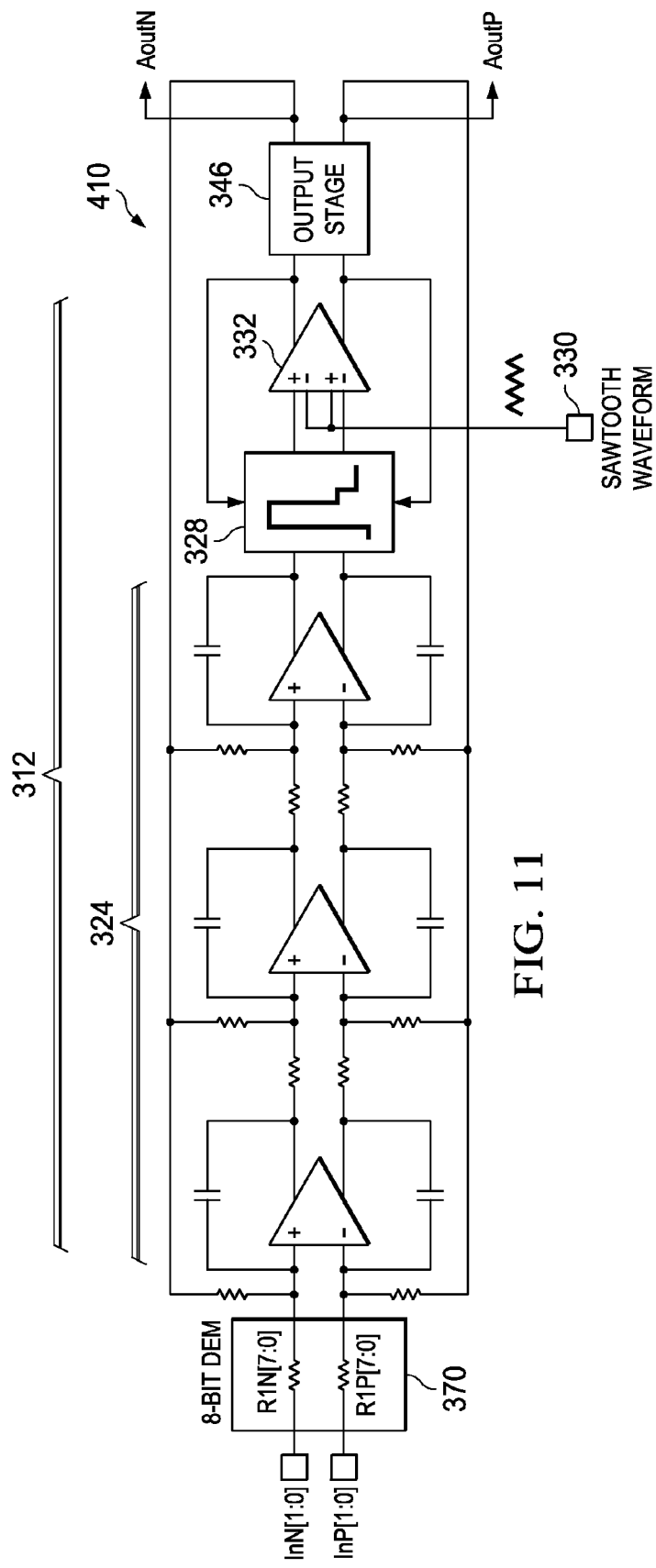
FIG. 11 is a schematic diagram of a class D modulator incorporating a differential PWM modulator configured to receive a multi-bit differential input signal and further incorporating dynamic element matching according to embodiments of the present invention.

According to one aspect of the present invention, dynamic element matching (DEM) is implemented at the input to the PWM modulator 312 to receive a multi-bit modulator input signal. Dynamic element matching is a technique that reduces mismatch errors by randomizing or dynamically rearranging the connection of mismatched devices so that the time average of the equivalent devices at each connection point are equal or nearly equal. FIG. 11 is a schematic diagram of a class D modulator incorporating a differential PWM modulator configured to receive a multi-bit differential input signal and further incorporating dynamic element matching according to embodiments of the present invention.

Referring to FIG. 11, the class D modulator 410 is constructed in a similar manner to the class D modulator 310 of FIG. 10 where like elements are given like reference numerals and will not be further discussed. In the present embodiment, dynamic element matching (DEM) is applied to average out resistance mismatches at the input resistors to the PWM modulator 312. More specifically, a DEM circuit 370 is incorporated at the input stage to the PWM modulator 312. The DEM circuit 370 includes a bank of resistors and the DEM circuit dynamically selects a subset of the resistors for use as the input resistors to receive the input data bits. In the present embodiment, the DEM circuit 370 is an 8-bit DEM circuit implemented using a bank of 8 resistors for each of the differential input signal. Thus, resistor bank R1N[7:0] is assigned to the InN input bits and resistor bank R1P[7:0] is assigned to the InP input bits. The 8 resistors are dynamically selected to receive the n-bit differential modulator input signal. For instance, when the modulator input signal has 2 bits, the 2-bit modulator input signal InN[1:0] and InP[1:0] are each dynamically assigned to the 8 resistors in their respective resistor banks.

Figure 12:
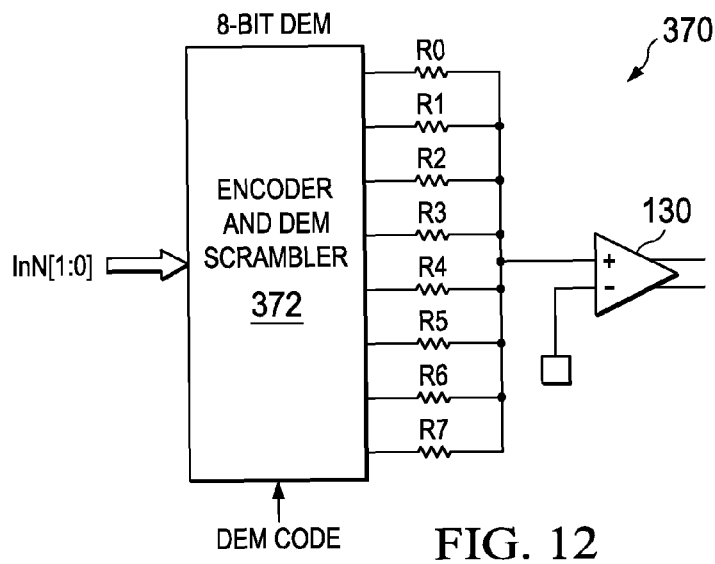
FIG. 12 illustrates a dynamic element matching circuit which can be applied to the differential PWM modulator according to embodiments of the present invention.

FIG. 12 illustrates a dynamic element matching circuit which can be applied to the differential PWM modulator according to embodiments of the present invention. FIG. 12 illustrates one half of the DEM circuit 370 for the InN data bits. It is understood that the other half of the DEM circuit for the InP data bits can be similarly constructed. Referring to FIG. 12, the DEM circuit 370 includes an encoder and DEM scrambler 372 receiving the n-bit modulator input signal being a 2-bit input signal InN[1:0] in the present embodiment. The DEM circuit 370 is an 8-bit DEM circuit and thus includes a resistor bank of 8 resistors R0 to R7. The encoder and DEM scrambler 372 connects the input bits to the selected resistors R0 to R7. The DEM scrambler 372 also receives a DEM code input to control the dynamic selection of the resistors R0 to R7.

In the present embodiment, the resistors R0 to R7 are identical resistors, that is, resistors of the same resistance values. Using identical resistors have the advantages over weighted resistors as it is easier to fabricate resistors with the same resistance values. When identical resistors are used in the DEM circuit, the data bits of the input signal InN must be converted from binary to thermometric code. The encoder 372 performs the binary-to-thermometric code conversion of the input signal in N. Furthermore, by nature of the 8-bit DEM circuit, the input to the PWM modulator is expanded to 9 levels in thermometric code (0 resistor selected to all 8 resistors selected). Thus the 2-bit input signal with four signal levels is mapped to the 9 input levels of the DEM circuit. In embodiments of the present invention, the four signal levels of the 2-bit input InN are mapped to input levels 0/8, 3/8, 5/8, and 8/8 with non-uniform distribution of the intervals so that better noise characteristics can be achieved at lower input levels. The encoder thus performs binary-to-thermometric conversion as well as mapping of the 2-bit input to the four selected input levels. The DEM scrambler 372 dynamically assigns the resistors to the converted data bits to average out the mismatch errors.

By using DEM at the input to the PWM modulator 312, errors due to device mismatches are reduced and the PWM modulator can generate output signals with low noise levels.

(3) Chopper Circuits

In the PWM modulator of FIGS. 10 and 11, the class D modulators are configured to receive differential input signal InN and InP and also to generate differential output signal AoutN and AoutP. The differential output signal AoutN and AoutP are fed back to the integrator 324 of the PWM modulator through respective resistor networks to realize the analog feedback control loop. If the resistors in the two resistor networks have device mismatches, the mismatch errors would affect the feedback control loop, degrading performance on total harmonic distortion and offset.

Figure 13:
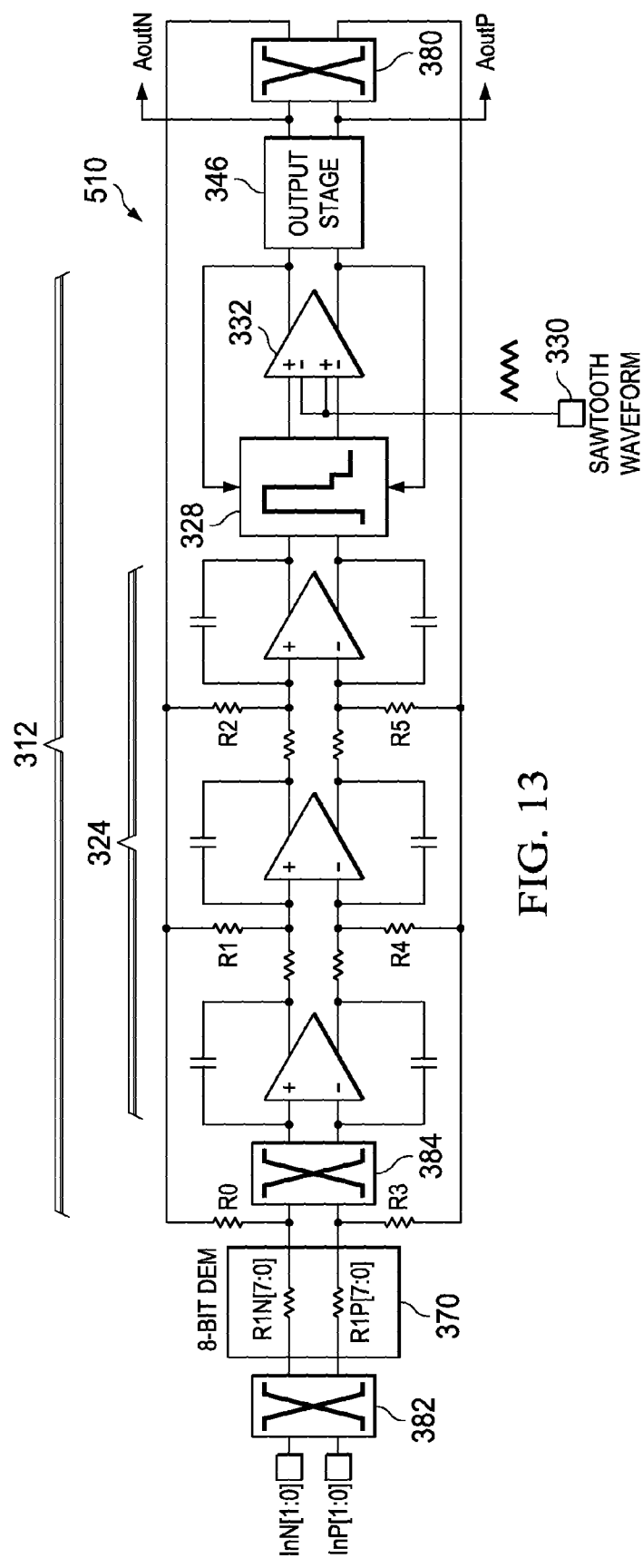
FIG. 13 is a schematic diagram of a class D modulator incorporating a differential PWM modulator incorporating an output chopper according to embodiments of the present invention.

According to another aspect of the present invention, the PWM modulator incorporates an output chopper circuit to balance out the two differential output signal feedback paths to average out mismatch errors between the two feedback resistor networks. FIG. 13 is a schematic diagram of a class D modulator incorporating a differential PWM modulator incorporating an output chopper according to embodiments of the present invention. Referring to FIG. 13, a class D modulator 510 is constructed in a similar manner to the class D modulator 410 of FIG. 11 where like elements are given like reference numerals and will not be further discussed.

In the class D modulator 510, an output chopper circuit 380 is coupled to the output terminals of the output stage 346 and receives the differential output audio signals AoutN and AoutP. The output chopper circuit 380 operates to dynamically switch the output signal feedback paths so that the differential output audio signals AoutN and AoutP are alternately coupled to one or the other of the output signal feedback paths. That is, the differential output signal AoutN and AoutP are fed back to the integrator 324 of the PWM modulator alternately through the resistor network formed by resistors R0 to R2 or the resistor network formed by resistors R3 to R5. In order to keep the polarity of the feedback output signals consistent with the signals at the differential input terminals, the class D modulator 510 also includes a first input chopper circuit 382 and a second input chopper circuit 384. The first input chopper circuit 382 is coupled to switch the differential input signal InN and InP at the input terminal and before the DEM circuit 370. The second input chopper circuit 384 is coupled to the summing node of the integrator 324 to switch the summed signal coupled to the first amplifier 325 of the integrator.

In this manner, device mismatches in the differential feedback paths of the class D modulator 510 and mismatches in the differential input resistors are reduced or averaged out. By removing mismatch errors in the output signal feedback loop, total harmonic distortion (THD), common mode rejection ratio (CMRR) and Power supply rejection ratio (PSRR) of the output audio signal can be improved.

In embodiments of the present invention, the output chopper circuit 380 operates at a frequency that is independent of or not related to the frequency of the input signal InN and InP.

The above detailed descriptions are provided to illustrate specific embodiments of the present invention and are not intended to be limiting. Numerous modifications and variations within the scope of the present invention are possible. The present invention is defined by the appended claims.

We claim:

1. An audio amplifier receiving a digital input audio signal and generating an output audio signal for driving a speaker, the audio amplifier comprising:
a digital input class D amplifier configured to receive the digital input audio signal and to generate the output audio signal, the digital input class D amplifier comprising:
a first modulator configured to receive the digital input audio signal and to generate a quasi-digital signal in n-bit; and
a class D modulator configured to receive the n-bit quasi-digital signal and to generate the output audio signal, the class D modulator implementing an analog feedback loop.

2. The audio amplifier of claim 1, wherein the first modulator comprises a digital-to-analog (DAC) modulator and the n-bit quasi-digital signal is processed by the DAC modulator without being processed by a DAC reconstruction filter.

3. The audio amplifier of claim 2, wherein the sigma-delta modulator comprises a $5^{th}$ order sigma-delta modulator.

4. The audio amplifier of claim 1, wherein the first modulator comprises an Nth order sigma-delta ($\Sigma\Delta$) modulator configured to receive the digital input audio signal in m-bit and to generate the quasi-digital signal in n-bit, the quasi-digital signal being an n-bit data stream.

5. The audio amplifier of claim 1, wherein the n-bit quasi-digital signal comprises a single-ended signal.

6. The audio amplifier of claim 1, wherein the n-bit quasi-digital signal comprises a differential signal.

7. The audio amplifier of claim 1, further comprising a level shifter circuit configured to receive the n-bit quasi-digital signal and to generate a level-adjusted output signal in n-bit, the level-adjusted output signal being independent of variations in a power supply voltage of the audio amplifier.

8. The audio amplifier of claim 7, wherein the level shifter circuit generates an n-bit differential signal as the level-adjusted output signal.

9. The audio amplifier of claim 1, wherein the class D modulator comprises:
a pulse-width modulation (PWM) modulator configured to receive the quasi-digital signal in n-bit and to generate a modulator output signal; and
an output stage configured to receive the modulator output signal and to generate the output audio signal on an output terminal.

10. The audio amplifier of claim 9, wherein the PWM modulator comprises:
an integrator configured to receive the quasi-digital signal and to low-pass filter the quasi-digital signal to generate an integrator output signal; and
a PWM comparator configured to receive the integrator output signal and a sawtooth waveform signal, the PWM comparator being configured to generate the modulator output signal indicative of the difference between the integrator output signal and the sawtooth waveform signal.

11. The audio amplifier of claim 9, wherein the PWM modulator comprises:
an integrator configured to receive the quasi-digital signal and to low-pass filter the quasi-digital signal to generate an integrator output signal;
a sample-and-hold (S&H) circuit configured to receive the integrator output signal and to generate a S&H output signal based on a control signal; and
a PWM comparator configured to receive the S&H output signal of the sample-and-hold circuit and a sawtooth waveform signal, the PWM comparator being configured to generate the modulator output signal indicative of the difference between the integrator output signal and the sawtooth waveform signal, the modulator output signal being applied as the control signal for the sample-and-hold circuit,
wherein the sample-and-hold circuit is operative to hold the signal level of the S&H output signal for a predetermined time period when the integrator output signal crosses over or under the sawtooth waveform signal.

12. The audio amplifier of claim 11, wherein the n-bit quasi-digital signal is coupled to the integrator through one or more input resistors and the PWM modulator further comprises a dynamic element matching (DEM) circuit coupled to receive the quasi-digital signal and to provide a signal indicative of the quasi-digital signal to the integrator through a bank of input resistors, the DEM circuit dynamically assigning the input resistors to data bits of the quasi-digital signal to average out mismatch errors of the bank of input resistors.

13. The audio amplifier of claim 12, wherein the bank of input resistors comprises q resistors of identical resistance values, where q is greater than n, the DEM circuit comprising an encoder and a scrambler, the encoder configured to perform binary to thermometric conversion of the n-bit quasi-digital signal and the scrambler configured to dynamically assign the q resistors to the converted data bits.

14. The audio amplifier of claim 11, wherein n-bit quasi-digital input signal comprises a differential input signal and the output audio signal comprises differential output audio signal, the class D modulator comprising a first output signal feedback path and a second output signal feedback path to feedback the differential output audio signal to the integrator, the class D modulator further comprising an output chopper circuit coupled to the output terminal of the output stage to receive the differential output audio signal, the output chopper circuit being configured to connect the differential output audio signal alternately to the first and second output signal feedback paths.

15. The audio amplifier of claim 14, wherein the class D modulator further comprise a first input chopper circuit coupled to differential summing nodes of the integrator, the first input chopper circuit being configured to connect the summed differential input and feedback signal alternately to differential input terminals of the integrator.

16. The audio amplifier of claim 15, wherein the n-bit quasi-digital signal is coupled to the integrator through one or more input resistors and the PWM modulator further comprises a dynamic element matching (DEM) circuit coupled to receive the quasi-digital signal and to provide a signal indicative of the quasi-digital signal to the integrator through a bank of input resistors, the DEM circuit dynamically assigning the input resistors to data bits of the quasi-digital signal to average out mismatch errors of the bank of input resistors, the class D modulator further comprising a second input chopper circuit coupled to differential input terminals of the DEM circuit to connect the differential input signal alternately to the differential input terminals of the DEM circuit.

17. The audio amplifier of claim 9, wherein the output stage comprises half-bridge switches.

18. The audio amplifier of claim 9, wherein the PWM modulator is configured using a cascaded integrators in feedback (CIFB) architecture and the integrator comprises a third order integrator.

* * * * *